US 10,950,819 B2

(12) United States Patent
Kim

(10) Patent No.: US 10,950,819 B2
(45) Date of Patent: Mar. 16, 2021

(54) ELECTROLUMINESCENCE DISPLAY DEVICE

(71) Applicant: LG Display Co., Ltd., Seoul (KR)

(72) Inventor: Sejin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 48 days.

(21) Appl. No.: 16/211,518

(22) Filed: Dec. 6, 2018

(65) Prior Publication Data

US 2019/0181376 A1 Jun. 13, 2019

(30) Foreign Application Priority Data

Dec. 7, 2017 (KR) .................. 10-2017-0167385

(51) Int. Cl.
| | | |
|---|---|---|
| *H01L 51/52* | (2006.01) | |
| *H01L 27/32* | (2006.01) | |
| *H01L 51/50* | (2006.01) | |
| *H01L 51/00* | (2006.01) | |

(52) U.S. Cl.
CPC ...... *H01L 51/5246* (2013.01); *H01L 27/3223* (2013.01); *H01L 27/3246* (2013.01); *H01L 27/3283* (2013.01); *H01L 51/5072* (2013.01); *H01L 51/5253* (2013.01); *H01L 27/3211* (2013.01); *H01L 51/0005* (2013.01); *H01L 51/5259* (2013.01)

(58) Field of Classification Search
CPC ............. H01L 27/3283; H01L 27/3246; H01L 51/5246; H01L 51/5253; H01L 27/3223
See application file for complete search history.

(56) References Cited

U.S. PATENT DOCUMENTS

| | | | |
|---|---|---|---|
| 7,459,177 B2 * | 12/2008 | Kimura | ............... H01L 51/0005 427/162 |
| 8,226,450 B2 | 7/2012 | Lee et al. | |
| 8,906,459 B2 | 12/2014 | Kim | |
| 2010/0227477 A1 | 9/2010 | Ito | |

FOREIGN PATENT DOCUMENTS

| | | |
|---|---|---|
| KR | 10-0676813 B1 | 1/2007 |
| KR | 10-2010-0038210 A | 4/2010 |
| KR | 10-2014-0125670 A | 10/2014 |
| KR | 10-2016-0141127 A | 12/2016 |

* cited by examiner

*Primary Examiner* — Amar Movva
(74) *Attorney, Agent, or Firm* — Morgan, Lewis & Bockius LLP

(57) ABSTRACT

An electroluminescence display device includes: a first substrate and a second substrate facing each other, a bank configured to define a plurality of emission areas on the first substrate, a light-emitting layer including: a first light-emitting layer in a first emission area among the plurality of emission areas, a second light-emitting layer in a second emission area among the plurality of emission areas, and a third light-emitting layer in a third emission area among the plurality of emission areas, a first dam at an outer portion of the bank, a second dam at an outer portion of the first dam, a dummy light-emitting layer between the first dam and the second dam, and a sealant overlapping the dummy light-emitting layer, the sealant being between the first dam and the second dam.

18 Claims, 10 Drawing Sheets

ELECTROLUMINESCENCE DISPLAY DEVICE

CROSS-REFERENCE TO RELATED APPLICATION(S)

This application claims the benefit of and priority to Korean Patent Application No. 10-2017-0167385, filed on Dec. 7, 2017, the entirety of which is hereby incorporated by reference.

BACKGROUND

1. Technical Field

The present disclosure relates to an electroluminescence display device, and more particularly, to an electroluminescence display device having a light-emitting layer formed by a solution process.

2. Discussion of the Related Art

An electroluminescence display device has a structure in which a light-emitting layer is formed between two electrodes, and the light-emitting layer emits light by an electric field between the two electrodes to display an image. The light-emitting layer may be formed of an organic material that emits light as excitons are generated by the combination of electrons and holes and are dropped from an exited state to a ground state. Otherwise, the light-emitting layer may be formed of an inorganic material, such as quantum dot. Hereinafter, a related art electroluminescence display device will be described with reference to the drawings.

FIG. 1 is a cross-sectional view of the electroluminescence display device according to the related art.

As illustrated in FIG. 1, the electroluminescence display device according to the related art may include a first substrate 10, a circuit element layer 20, a first electrode 30, a bank 40, and a light-emitting layer 50. The circuit element layer 20 is formed on the first substrate 10. Various signal lines, thin film transistors, capacitors, and the like, are formed on the circuit element layer 20. The first electrode 30 is formed on the circuit element layer 20. The first electrode 30 is patterned and formed in each pixel and serves as an anode of the electroluminescence display device. The bank 40 has a matrix structure to define the emission areas. The light-emitting layer 50 is formed in an emission area defined by the bank 40.

The electroluminescence display device according to the related art may have a problem in which the light emission in a middle region of the substrate 10 and the light emission in an edge region of the substrate 10 are not uniform. More specifically, when the light-emitting layer 50 is formed through a solution process, a solution for forming the light-emitting layer 50 is dropped to an emission area, and then the solution is dried. Here, the dry rates in the middle region and an edge region of the substrate 10 may be different. The difference between the dry rates may cause the light-emitting layer 50 in the middle region of the substrate 10 and the light-emitting layer 50 in the edge region of the substrate 10 to have different profiles, resulting in non-uniform light emission between the middle region of the substrate 10 and the edge region of the substrate 10.

SUMMARY

Accordingly, embodiments of the present disclosure are directed to an electroluminescence display device that substantially obviates one or more of the issues due to limitations and disadvantages of the related art.

An aspect of the present disclosure is to provide an electroluminescence display device in which light emission occurs uniformly between a central region of a substrate and an edge region of the substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescence display device, including: a first substrate and a second substrate facing each other, a bank configured to define a plurality of emission areas on the first substrate, a light-emitting layer including: a first light-emitting layer in a first emission area among the plurality of emission areas, a second light-emitting layer in a second emission area among the plurality of emission areas, and a third light-emitting layer in a third emission area among the plurality of emission areas, a first dam at an outer portion of the bank, a second dam at an outer portion of the first dam, a dummy light-emitting layer between the first dam and the second dam, and a sealant overlapping the dummy light-emitting layer, the sealant being between the first dam and the second dam.

In another aspect, there is provided an electroluminescence display device, including: a first substrate including: an active area configured to display an image, and a second substrate facing the first substrate, a bank configured to define an emission area in the active area, a light-emitting layer in the emission area, a first dam and a second dam configured to define a dummy emission area, and surrounding the active area, a dummy light-emitting layer in the dummy emission area, and a sealant overlapping the dummy light-emitting layer, the sealant being between the first substrate and the second substrate.

In another aspect, there is provided an electroluminescence display device, including: a first substrate and a second substrate including an active area displaying an image and a bonding area provided at an outer portion of the active area, a dummy light-emitting layer provided in the bonding area, a sealant overlapping the dummy light-emitting layer, the sealant being configured to bond the first substrate and the second substrate, and a light-emitting layer in the active area.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
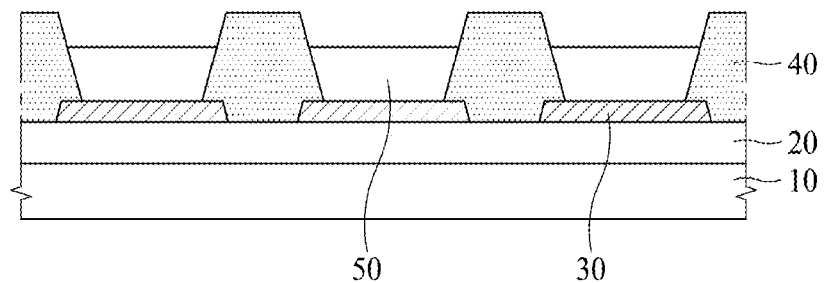
FIG. 1 is a cross-sectional view illustrating the electroluminescence display device according to the related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, example embodiments of the present disclosure will be described in detail with reference to the accompanying drawings.

Figure 2:
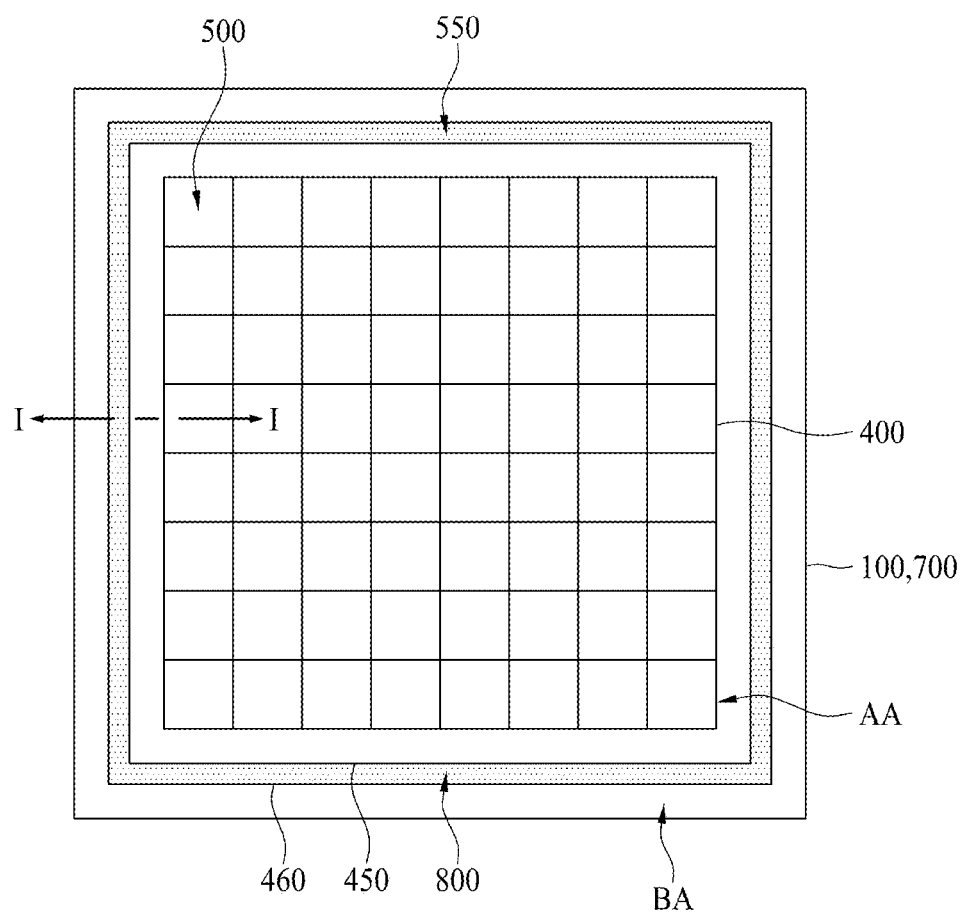
FIG. 2 is a plan view illustrating an electroluminescence display device according to an embodiment of the present disclosure.

FIG. 2 is a plan view illustrating an electroluminescence display device according to an embodiment of the present disclosure.

As illustrated in FIG. 2, an electroluminescence display device according to an embodiment of the present disclosure may include a first substrate 100 and a second substrate 700 including an active area AA and a bonding area BA. The active area AA may serve as a display area for displaying an image. The active area AA may include a plurality of pixels, and each of the plurality of pixels has an emission area. For example, each pixel provided in the active area AA may include signal lines, such as a gate line, a data line, a power line, and a reference line, a plurality of thin film transistors for switching transmission of the signals applied through the signal lines, and a light-emitting device driven by the plurality of thin film transistors to emit light.

A bank 400 may be formed in a matrix structure in the active area AA to define an emission area. A light-emitting layer 500 may be formed in the emission area defined by the bank 400. In each pixel, an opening, in which the bank 400 is not formed, may be the emission area. The bonding area BA may surround the active area AA. For example, the bonding area BA may be on upper, lower, right, and left outer portions of the active area AA.

In the bonding area BA, the first substrate 100 and the second substrate 700 may be bonded to each other. A first dam 450, a second dam 460, and a sealant 800 may be provided in the bonding area BA to bond the first substrate 100 and the second substrate 700.

The first dam 450, the second dam 460, and the sealant 800 may surround the active area AA at an outer portion of the active area AA. The first dam 450 may be adjacent to the active area AA, and may surround the active area AA. The second dam 460 may surround the active area AA at an outer portion of the first dam 450. The sealant 800 may be between the first dam 450 and the second dam 460.

The first dam 450 and the second dam 460 may provide a space for forming the sealant 800. The first substrate 100 and the second substrate 700 may be bonded to each other by the sealant 800 provided between the first dam 450 and the second dam 460.

A dummy light-emitting layer 550 may be additionally formed in the bonding area BA. For example, the dummy light-emitting layer 550 may be between the first dam 450 and the second dam 460. That is, a dummy emission area may be defined between the first dam 450 and the second dam 460, and the dummy light-emitting layer 550 may be formed in the dummy emission area. The dummy emission area may surround the active area AA at an outer portion of the active area AA. Accordingly, the dummy light-emitting layer 550 may also surround the active area AA at the outer portion of the active area AA. As a result, the first dam 450 and the second dam 460 may provide a space for forming the sealant 800 and the dummy light-emitting layer 550. The sealant 800 and the dummy light-emitting layer 550 may overlap each other in the dummy emission area between the first dam 450 and the second dam 460.

As described above, according to an embodiment of the present disclosure, because the dummy light-emitting layer 550 is provided in the bonding area BA, the light emission may be uniformly made between the middle region and the edge region of the active area AA. For example, when the light-emitting layer 500 is formed in the active area AA and the dummy light-emitting layer 550 is formed in the bonding area BA by an inkjet process, a profile of the dummy light-emitting layer 550 and a profile of the light-emitting layer 500 may not be uniform. However, a plurality of light-emitting layers 500 in the active area AA may have uniform profiles. Therefore, a problem that the light emission is not uniform between the middle region and the edge region of the active area AA may be reduced or prevented.

According to an embodiment of the present disclosure, because it may be optional to form a dummy region between the active area AA and the bonding area BA to make uniform light emission in the entire active area AA, a bezel width of the electroluminescence display device may be reduced. In other words, it may be possible to form a dummy region between the active area AA and the bonding area BA and to form a dummy light-emitting layer in the dummy region to make the profile of the light-emitting layer 500 between the middle region and the edge region of the active area AA uniform. In this case, however, because the dummy region is further formed, a non-display area of the electroluminescence display device may be increased. Accordingly, the width of the bezel may be increased.

In contrast, according to one embodiment of the present disclosure, when the dummy light-emitting layer 550 is formed in the bonding area BA, an additionally separated dummy region may not be required. Thus, the bezel width may be reduced. That is, according to an embodiment of the present disclosure, because the bonding area BA is adjacent to the active area AA, for example, when the first dam 450 is formed adjacent to the outermost bank 400 of the active area AA, the width of the bezel of the electroluminescence display device may be reduced.

Figure 3:
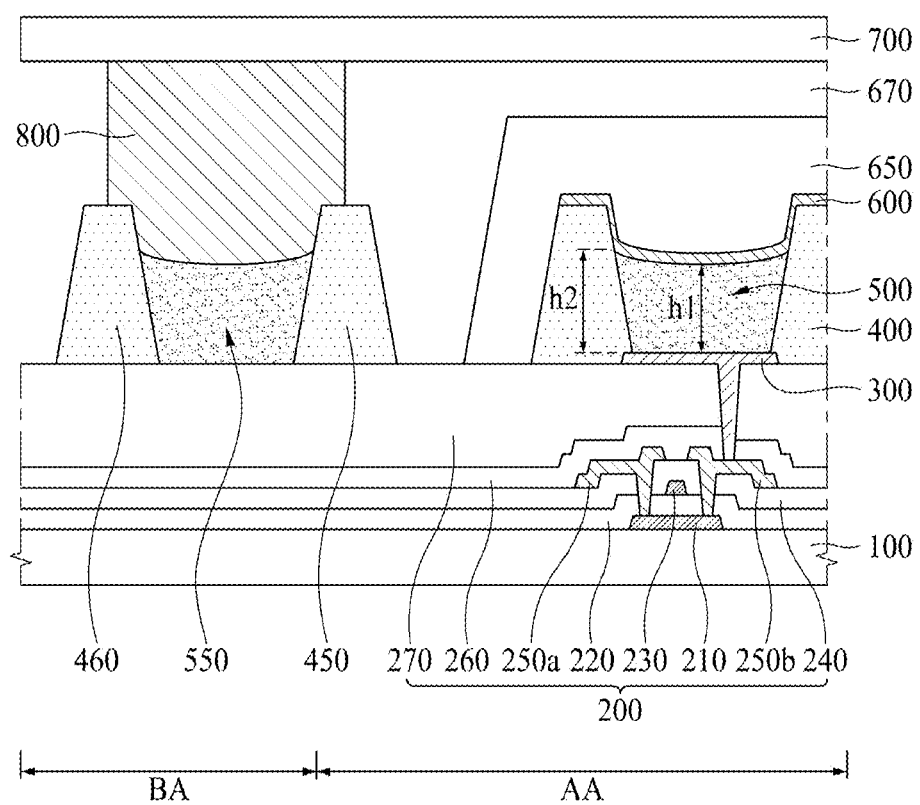
FIG. 3 is a cross-sectional view illustrating an electroluminescence display device according to an embodiment of the present disclosure, taken along line I-I of FIG. 2.

FIG. 3 is a cross-sectional view illustrating an electroluminescence display device according to an embodiment of the present disclosure, taken along line I-I of FIG. 2.

As illustrated in FIG. 3, the electroluminescence display device according to an embodiment of the present disclosure may include the first substrate 100, a circuit element layer 200, a first electrode 300, the bank 400, the first dam 450, the second dam 460, the light-emitting layer 500, the dummy light-emitting layer 550, a second electrode 600, an encapsulation layer 650, a filling layer 670, the second substrate 700, and the sealant 800. The first substrate 100 may be formed of glass or plastic, but embodiments are not limited thereto. The first substrate 100 may be formed of a transparent material or an opaque material.

The electroluminescence display device according to an embodiment of the present disclosure may be a "top-emission" type in which light may be emitted upwards. In this case, as a material of the first substrate 100, an opaque material, as well as a transparent material, may be used. Also, the electroluminescence display device according to an embodiment of the present disclosure may be a "bottom-emission" type in which light may be emitted downwards. In this case, as a material of the first substrate 100, a transparent material may be used.

The circuit element layer 200 may be formed on the first substrate 100. The circuit element layer 200 may include an active layer 210, a gate insulating layer 220, a gate electrode 230, an interlayer insulating layer 240, a source electrode 250a, a drain electrode 250b, a passivation layer 260, and a planarization layer 270.

The active layer 210 may be on the first substrate 100. The active layer 210 may be formed of a silicon-based semiconductor material or an oxide semiconductor material, but embodiments are not limited thereto. Although not shown, a light blocking layer may be additionally provided between the first substrate 100 and the active layer 210 to prevent light from entering the active layer 210, thus reducing or preventing deterioration of the active layer 210.

The gate insulating layer 220 may be on the active layer 210 to insulate the active layer 210 from the gate electrode 230. The gate electrode 230 may be on the gate insulating layer 220. The interlayer insulating layer 240 may be on the gate electrode 230 to insulate the gate electrode 230 from the source/drain electrodes 250a and 250b.

The source electrode 250a and the drain electrode 250b may be spaced apart from each other on the interlayer insulating layer 240 and may face each other. The source electrode 250a and the drain electrode 250b may be connected to one end and the other end of the active layer 210 through a contact hole provided on the interlayer insulating layer 240 and the gate insulating layer 220, respectively.

The passivation layer 260 may be on the source electrode 250a and the drain electrode 250b, and may protect the thin film transistor. The planarization layer 270 may be on the passivation layer 260 to planarize a surface above the first substrate 100.

In this manner, the circuit element layer 200 may include a thin film transistor, including the gate electrode 230, the active layer 210, the source electrode 250a, and the drain electrode 250b. FIG. 3 illustrates a thin film transistor having a top-gate structure in which the gate electrode 230 is on an active layer 210, but embodiments are not limited thereto. For example, a thin film transistor having a bottom-gate structure in which the gate electrode 230 is below the active layer 210 may also be in the circuit element layer 200.

The circuit element layer 200 may include a circuit element including various signal lines, a thin film transistor, a capacitor, and the like. The signal lines may include a gate line, a data line, a power line, and a reference line. The thin film transistors may include a switching thin film transistor, a driving thin film transistor, and a sensing thin film transistor.

The switching thin film transistor may be switched according to a gate signal supplied to the gate line to supply a data voltage supplied from the data line to the driving thin film transistor. The driving thin film transistor may be switched according to a data voltage supplied from the switching thin film transistor to generate a data current from power supplied from the power line, and may supply the generated data current to the first electrode 300.

The sensing thin film transistor may sense a threshold voltage variation of the driving thin film transistor, which may cause deterioration of image quality. In response to a sensing control signal supplied from the gate line or the separate sensing line, the sensing thin film transistor may supply a current from the driving thin film transistor to the reference line.

The capacitor, which may maintain the data voltage supplied to the driving TFT during one frame, may be connected to each of a gate terminal and a source terminal of the driving TFT. Such a circuit element may be in the active area AA on the first substrate 100, and may not be in the bonding area BA. However, a line connected to the circuit element may extend to a pad region provided on an outer portion of the bonding area BA via the bonding area BA. Insulating layers, e.g., a gate insulating layer 220, an interlayer insulating layer 240, a passivation layer 260, and a planarization layer 270 of the circuit element layer 200, may be in the bonding area BA. However, embodiments of the present disclosure are not limited thereto. For example, only some of the insulating layers in the circuit element layer 200 may be in the bonding area BA or, in some cases, the circuit element layer 200 may not be in the bonding area BA.

The first electrode 300 may be on the circuit element layer 200. The first electrode 300 may be patterned and formed in each pixel in the active area AA, and may serve as an anode of the electroluminescence display device.

When the electroluminescence display device according to an embodiment of the present disclosure is configured as a top-emission type, the first electrode 300 may include a reflective material for reflecting light emitted from the light-emitting layer 500 upwards. In this case, the first electrode 300 may have a stacked structure of a transparent conductive material and the reflective material. When the electroluminescence display device according to an embodiment of the present disclosure is a bottom-emission type, the first electrode 300 may be formed of a transparent conductive material.

The first electrode 300 may be connected to the drain electrode 250b of the thin film transistor through a contact hole in the planarization layer 270 and the passivation layer 260. In some cases, the first electrode 300 may be connected to the source electrode 250a of the thin film transistor through the contact hole in the planarization layer 270 and the passivation layer 260.

The bank 400 may be at a boundary between each of pixels in the active area AA, and may define an emission area in each of the plurality of pixels. The bank 400 may be on the circuit element layer 200, while covering both ends of the first electrode 300. Accordingly, a plurality of first electrodes 300 patterned and formed in each of the plurality of pixels may be insulated by the bank 400.

The first dam 450 and the second dam 460 may be formed on the circuit element layer 200 in the bonding area BA. The first dam 450 is provided at an outer portion of the bank 400 and the second dam 460 is provided at an outer portion of the first dam 450. The first dam 450 may include a first layer 451 and a second layer 452. The second dam 460 may include a first layer 461 and a second layer 462, which may correspond to the first layer 451 and the second layer 452 of the first dam 450.

The first dam 450 and the second dam 460 may be formed of the same material or materials through the same process as that of the bank 400. In this case, any separated processes for forming the first dam 450 and the second dam 460 are not required. Thus, the manufacturing processes may be simplified.

The light-emitting layer 500 may be on the first electrode 300 in the active area AA. The light-emitting layer 500 may be in the emission area defined by the bank 400. The light-emitting layer 500 may include a red light-emitting layer, a green light-emitting layer, and a blue light-emitting layer in each pixel. The light-emitting layer 500 may include a white light-emitting layer in each pixel.

The light-emitting layer 500 may be patterned and formed in each emission area without a mask, e.g., by an inkjet process. In this case, a height h1 of an upper end of the light-emitting layer 500 at the center of the emission area, after the solution for the light-emitting layer 500 is dried, may be lower than a height h2 of an upper end of the light-emitting layer 500 at the end of the emission area, for example, in contact with the bank 400. For example, as illustrated, a profile in which the height of the light-emitting layer 500 gradually decreases from the end of the emission area in contact with the bank 400 toward the center of the emission area may be obtained. Accordingly, a portion of the second electrode 600 formed on the light-emitting layer 500 may have a profile corresponding to the profile of the light-emitting layer 500. The light-emitting layer 500 may include at least one organic layer among a hole injecting layer HIL, a hole transporting layer HTL, an emission material layer EML, and an electron transporting layer ETL.

The dummy light-emitting layer 550 may be between the first dam 450 and the second dam 460 in the bonding area BA. That is, a dummy emission area may be defined between the first dam 450 and the second dam 460, and the dummy light-emitting layer 550 may be in the dummy emission area.

The dummy light-emitting layer may be formed by an ink jet process at the same time with the light-emitting layer 500. Therefore, the dummy light-emitting layer 550 may also have a profile similar to that of the light-emitting layer 500.

The second electrode 600 may be on the light-emitting layer 500 in the active area AA, and may serve as a cathode of the electroluminescence display device. The second electrode 600 may be provided, not only on the light-emitting layer 500, but also on the bank 400, and may be on the plurality of pixels and a boundary therebetween. Therefore, the second electrode 600 may serve as a common electrode applying a common voltage to the plurality of pixels.

When the electroluminescence display device according to an embodiment of the present disclosure is configured as a top-emission type, the second electrode 600 may be formed of a transparent conductive material to transmit light emitted from the light-emitting layer 500 upwards, or may have a small thickness to increase transmittance. When the electroluminescence display device according to an embodiment of the present disclosure is a bottom-emission type, the second electrode 600 may include a reflective material to reflect light emitted from the light-emitting layer 500 downwards.

The encapsulation layer 650 may be on the second electrode 600 in the active area AA. The encapsulation layer 650 may prevent ambient moisture from permeating into the light-emitting layer 500. The encapsulation layer 650 may extend from a top surface of the second electrode 600 to a side surface of the circuit element layer 200 to block a permeation path of moisture that may enter the light-emitting layer 500. The encapsulation layer 650 may be formed of an inorganic insulating material, or may have a structure in which an inorganic insulating material and an organic insulating material are alternately stacked, but embodiments of the present disclosure are not limited thereto.

The filling layer 670 may be on the encapsulation layer 650 in the active area AA. For example, the filling layer 670 may fill a space between the encapsulation layer 650 and the second substrate 700. The filling layer 670 may extend to a top surface of the circuit element layer 200, and may be in contact with each of the first dam 450 and the sealant 800.

The second substrate 700 may be on the filling layer 670. The second substrate 700 may be bonded to the first substrate 100 by the sealant 800. For example, the second substrate 700 may be bonded to the first dam 450 and the second dam 460 on the first substrate 100 by the sealant 800.

The sealant 800 may be provided in the dummy emission area between the first dam 450 and the second dam 460 in the bonding area BA. For example, the sealant 800 may be on the dummy light-emitting layer 550 provided in the dummy emission area. The sealant 800 may be on upper surfaces of the first dam 450 and the second dam 460 so that the second substrate 700 may be bonded to the first dam 450 and the second dam 460.

The sealant 800 may include a moisture-proof material to prevent ambient moisture from permeating into the inner side. To improve the moisture-proof effect, the entire upper surface of the sealant 800 may be in direct contact with a lower surface of the second substrate 700.

Figure 4:
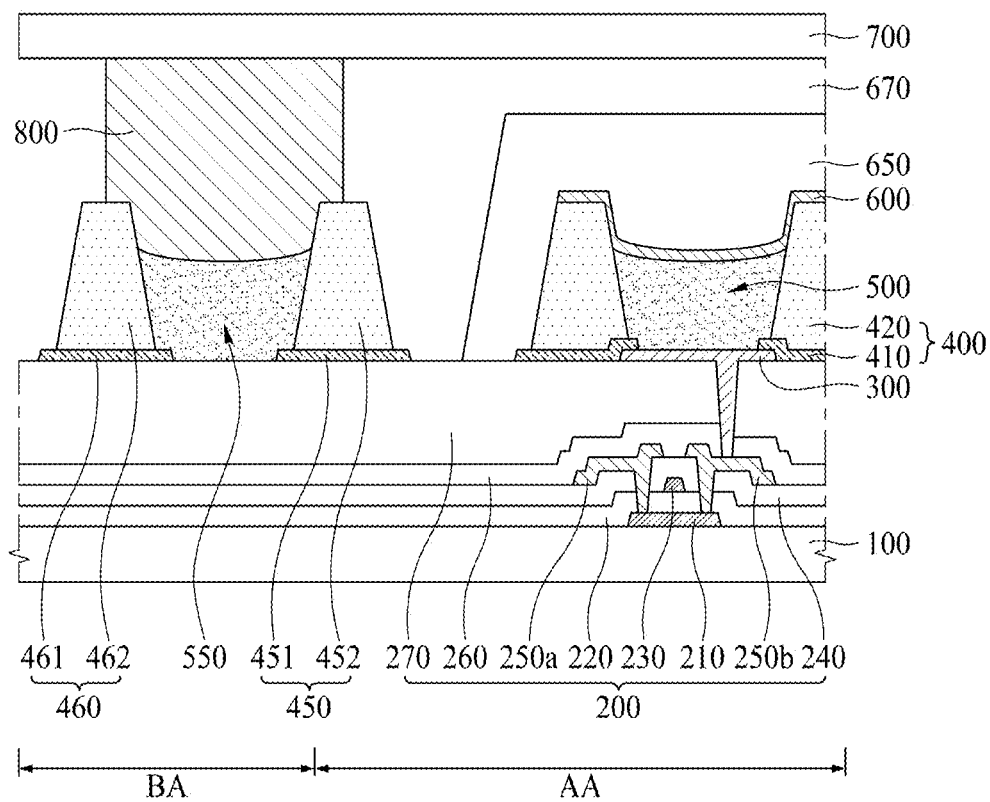
FIG. 4 is a cross-sectional view illustrating an electroluminescence display device according to another embodiment of the present disclosure, taken along line I-I of FIG. 2.

FIG. 4 is a cross-sectional view illustrating an electroluminescence display device according to another embodiment of the present disclosure, which corresponds to a cross-section taken along the line I-I of FIG. 2.

The electroluminescence display device according to FIG. 4 is substantially similar to the electroluminescence display device according to FIG. 3 described above, except that the configuration of the bank 400 is changed. Therefore, the same reference numerals are given to the same components, and only the different components will be described in detail below.

With reference to FIG. 4, the bank 400 may include a first bank 410 and a second bank 420. The first bank 410 may be on the circuit element layer 200, while covering an end of the first electrode 300. The first bank 410 may be thinner than the second bank 420, and may have a width larger than that of the second bank 420. The first bank 410 having such a structure may have the same hydrophilic properties as the light-emitting layer 500. The first bank 410 having the hydrophilic properties may be formed of an inorganic insulating material, such as silicon oxide. Therefore, when the light-emitting layer 500 is formed by an inkjet process, a solution for forming the light-emitting layer 500 may be easily spread on the first bank 410.

The second bank 420 may be on the first bank 410. The second bank 420 may have a narrower width than the first bank 410. The second bank 420 may be patterned and formed through a photolithography process after applying a solution mixed with a hydrophobic material, such as fluorine to an organic insulating material having hydrophilic properties. The hydrophobic material, such as fluorine, may be moved to an upper portion of the second bank 420 due to light irradiated in the photolithography process. Accordingly, the upper portion of the second bank 420 may have hydrophobic properties, whereas the other portions may have hydrophilic properties. That is, the lower portion of the second bank 420 in contact with the first bank 410 may have hydrophilic properties, and the upper portion of the second bank 420 may have hydrophobic properties. However, embodiments of the present disclosure are not limited thereto, and the entirety of the second bank 420 may have hydrophobic properties.

The spreadability of the solution for forming the light-emitting layer 500 may be improved by the lower portions of the first bank 410 and the second bank 420 having the hydrophilic properties. For example, when the first bank 410 has a smaller thickness and a larger width than the second bank 420, a two-step structure having hydrophilic properties may be provided by the combination of the first bank 410 and the second bank 420, and the solution for forming the light-emitting layer 500 may be easily spread to left and right ends of the emission area. Also, when the solution for forming the light-emitting layer 500 is prevented from spreading to the neighboring another emission area by the upper portion of the second bank 420 having the hydrophobic properties, the light-emitting layers 500 may be prevented from being mixed between the neighboring emission areas.

The first layer 451 and the second layer 452 of the first dam 450 and the first layer 461 and the second layer 462 of the second dam 460 may correspond to the first bank 410 and a second bank 420. Thus, when the first dam 450 and the second dam 460 are formed of the same material or materials through the same process as that of the bank 400, the first layer 451 and the second layer 452 of the first dam 450 and the first layer 461 and the second layer 462 of the second dam 460 may be formed of the same material or materials through the same process as that of the first bank 410 and a second bank 420.

Figure 5:
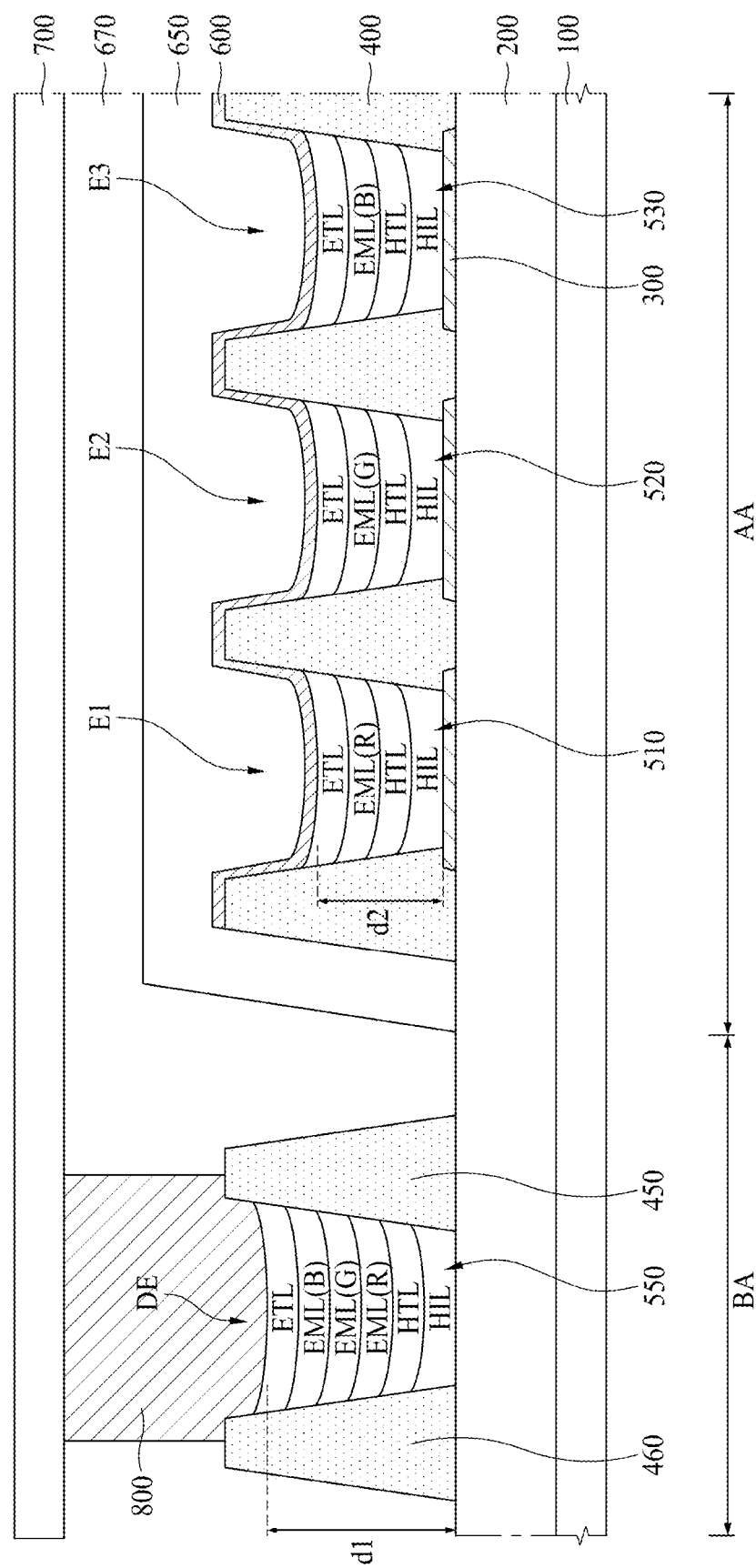
FIG. 5 is a cross-sectional view illustrating an electroluminescence display device according to still another embodiment of the present disclosure.

FIG. 5 is a cross-sectional view illustrating an electroluminescence display device according to still another embodiment of the present disclosure.

In FIG. 5, a plurality of emission areas E1, E2, and E3 may be formed in the active area AA. Other structures are substantially similar to that of FIG. 3 described above, and thus, only different components will be described in detail hereinafter.

According to FIG. 5, a first emission area E1, a second emission area E2, and a third emission area E3 may be defined by the bank 400. A first light-emitting layer 510 may be in the first emission area E1, a second light-emitting layer 520 may be in the second emission area E2, and a third light-emitting layer 530 may be in the third emission area E3.

The first light-emitting layer 510 may include a hole injecting layer HIL, a hole transporting layer HTL, a red light-emitting material layer EML(R), and an electron transporting layer ETL. The second light-emitting layer 520 may include a hole injecting layer HIL, a hole transporting layer HTL, a green light-emitting material layer EML(G), and an electron transporting layer ETL. The third light-emitting layer 530 may include a hole injecting layer HIL, a hole transporting layer HTL, a blue light-emitting material layer EML(B), and an electron transporting layer ETL.

In each of the light-emitting layers 510, 520, and 530, the hole injecting layer HIL may be on the first electrode 300, the hole transporting layer HTL may be on the hole injecting layer HIL, the red/green/blue light-emitting material layers EML(R)/EML(G)/EML(B) may each be on a respective portion of the hole transporting layer HTL, and the electron transporting layer ETL may be on the red/green/blue light-emitting material layers EML(R)/EML(G)/EML(B).

Accordingly, the red light may be emitted from the first light-emitting layer 510, the green light may be emitted from the second light-emitting layer 520, and the blue light may be emitted from the third light-emitting layer 530. For example, a peak wavelength of photoluminescence (PL) of the first light-emitting layer 510 may be within a range of about 600 nm to 650 nm, a peak wavelength of PL of the second light-emitting layer 520 may be within a range of about 500 nm to 550 nm, and a peak wavelength of PL of the third light-emitting layer 530 may be within a range of about 430 nm to 480 nm.

A dummy emission area DE may be defined between the first dam 450 and the second dam 460. A dummy light-emitting layer 550 is formed in the dummy emission area DE.

The dummy light-emitting layer 550 may include a hole injecting layer HIL, a hole transporting layer HTL, a red light-emitting material layer EML(R), a green light-emitting material layer EML(G), a blue light-emitting material layer EML(B), and an electron transporting layer ETL. In the dummy light-emitting layer 550, the hole injecting layer HIL may be on the circuit element layer 200, the hole transporting layer HTL may be on the hole injecting layer HIL, the red light-emitting material layer EML(R) may be on the hole transporting layer HTL, the green light-emitting material layer EML(G) may be on the red light-emitting material layer EML(R), the blue light-emitting material layer EML(B) may be on the green light-emitting material layer EML(G), and the electron transporting layer ETL may be on the blue light-emitting material layer EML(B).

Each of the light-emitting layers 510, 520, and 530 may include only any one of the red light-emitting material layer EML(R), the green light-emitting material layer EML(G), and the blue light-emitting material layer EML(B). However, the dummy light-emitting layer 550 may include all the red light-emitting material layer EML(R), the green light-emitting material layer EML(G), and the blue light-emitting material layer EML(B). Therefore, a first height d1 of the dummy light-emitting layer 550 may be higher than a second height d2 of the light-emitting layers 510, 520, and 530. The first height d1 of the dummy light-emitting layer 550 refers to a height in a central region between the first dam 450 and the second dam 460, and the second height d2 of the light-emitting layers 510, 520, and 530 refers to a height in a central region of each of the emission areas E1, E2, and E3.

According to an embodiment of the present disclosure, when the hole injecting layer HIL is formed in each of the emission areas E1, E2, and E3 using an inkjet process, the hole injecting layer HIL may also be formed in the dummy emission area DE. Here, a profile of the hole injecting layer HIL of the dummy emission area DE and profiles of the hole injecting layers HIL of the emission areas E1, E2, and E3 may not be uniform, but a uniform profile may be obtained among the hole injecting layers HIL of the emission areas E1, E2, and E3. In the case of the hole transporting layer HTL, the red light-emitting material layer EML(R), the green light-emitting material layer EML(G), the blue light-emitting material layer EML(B), and the electron transporting layer ETL, a non-uniform profile may be obtained between the emission areas E1, E2, and E3 and the dummy emission area DE as in the case of the hole injecting layer HIL described above, but a uniform profile may be obtained in the emission areas E1, E2 and E3.

According to an embodiment of the present disclosure, the red light-emitting material layer EML(R) may be firstly formed in the first emission area E1, the green light-emitting material layer EML(G) may be secondly formed in the second emission area E2, and the blue light-emitting material layer EML(B) may be finally formed in the third emission area E3. In this case, the red light-emitting material layer EML(R), the green light-emitting material layer EML(G), and the blue light-emitting material layer EML(B) may be sequentially stacked in the dummy emission area DE.

However, embodiments of the present disclosure are not limited thereto. For example, the red light-emitting material layer EML(R) may be firstly formed in the first emitting region E1, the blue light-emitting material layer EML(B) may be secondly formed in the third emission area E3, and the green light-emitting material layer EML(G) may be finally formed in the second emission area E2. In this case, the red light-emitting material layer EML(R), the blue light-emitting material layer EML(B), and the green light-emitting material layer EML(G) may be sequentially stacked in the dummy emission area DE.

In this manner, in the dummy emission area DE, stacking order of the red light-emitting material layer EML(R), the blue light-emitting material layer EML(B), and the green light-emitting material layer EML(G) may be determined according to stacking order of the red light-emitting material layer EML(R), the blue light-emitting material layer EML(B), and the green light-emitting material layer EML(G) in the emission areas E1, E2 and E3. As such, in the dummy light-emitting layer 550, stacking order of the red light-emitting material layer EML(R), the green light-emitting material layer EML(G), and the blue light-emitting material layer EML(B) may be variously changed.

Because the dummy emission area DE does not have any of a circuit element, the first electrode 300, or the second electrode 600, the dummy light-emitting layer 550 may not emit light. However, when an electrode for light emission and a circuit element are connected to the configuration of the dummy light-emitting layer 550, a peak wavelength of photoluminescence (PL) of the dummy light-emitting layer 550 may be within a range of about 600 nm to 650 nm. When the dummy light-emitting layer 550 includes all the red light-emitting material layer EML(R), the green light-emitting material layer EML(G), and the blue light-emitting material layer EML(B), energy transfer may takes place in a long wavelength range, and a peak wavelength may occur in the long wavelength range.

FIGS. 6 to 9 are cross-sectional views illustrating the structures of various electroluminescence display devices according to various embodiments of the present disclosure.

The electroluminescence display devices of FIGS. 6 to 9 are substantially similar to the electroluminescence display device described above with reference to FIG. 5, except that the configuration of the dummy light-emitting layer 550 is changed. Therefore, only different components will be described in detail hereinafter.

Figure 6:
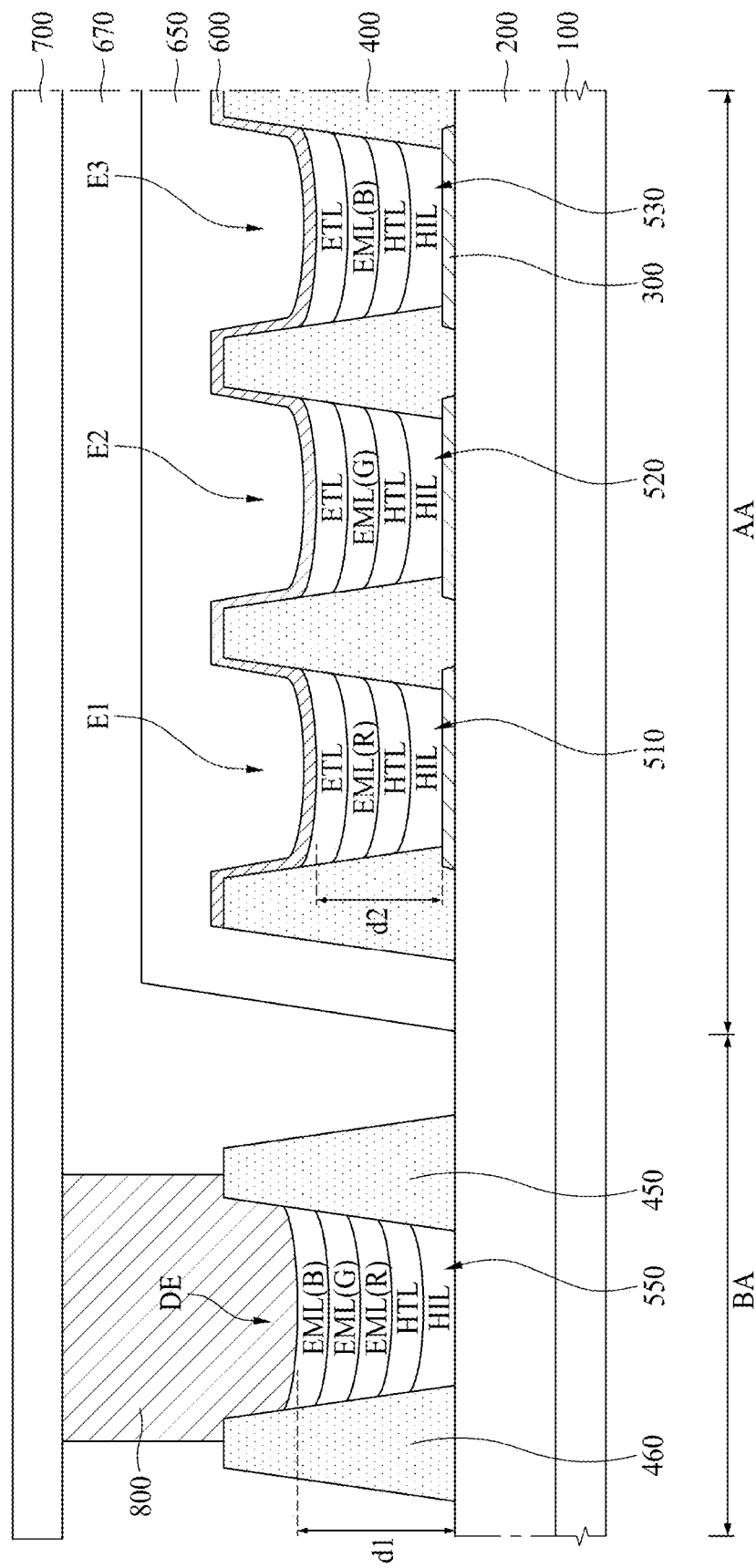
FIGS. 6 to 9 are cross-sectional views illustrating the structures of various electroluminescence display devices according to various embodiments of the present disclosure.

With reference to FIG. 6, the dummy light-emitting layer 550 may include the hole injecting layer HIL, the hole transporting layer HTL, the red light-emitting material layer EML(R), the green light-emitting material layer EML(G), and the blue light-emitting material layer EML(B). That is, unlike in the example of FIG. 5, the dummy light-emitting layer 550 in FIG. 6 does not include the electron transporting layer ETL.

According to FIG. 6, the electron transporting layer ETL provided in each of the light-emitting layers 510, 520, and 530 may be formed by a deposition process, rather than by a solution process. Thus, because a separate dry process may not be required, profiles of the electron transporting layers may not be different between the middle portions and the edge of the substrate. For this reason, the dummy light-emitting layer 550 may not include the electron transporting layer ETL. In this case, the electron transporting layer ETL provided in each of the light-emitting layers 510, 520, and 530 may be separately patterned and formed in each of the emission areas E1, E2, and E3 through a deposition process using a mask, but embodiments of the present disclosure are not limited thereto. For example, the electron transporting layer ETL may be additionally formed on a boundary region, e.g., on the bank 400, as well as in each of the emission areas E1, E2, and E3, like the second electrode 600.

Similar to the case of FIG. 5 described above, in FIG. 6, the first height d1 of the dummy light-emitting layer 550 may be higher than the second height d2 of the light-emitting layers 510, 520, and 530. Also, in FIG. 6, when an electrode for light emission and a circuit element are connected to the dummy light-emitting layer 550, a peak wavelength of PL of the dummy light-emitting layer 550 may be within a range of about 600 nm to 650 nm, like the case of FIG. 5 described above.

Figure 7:
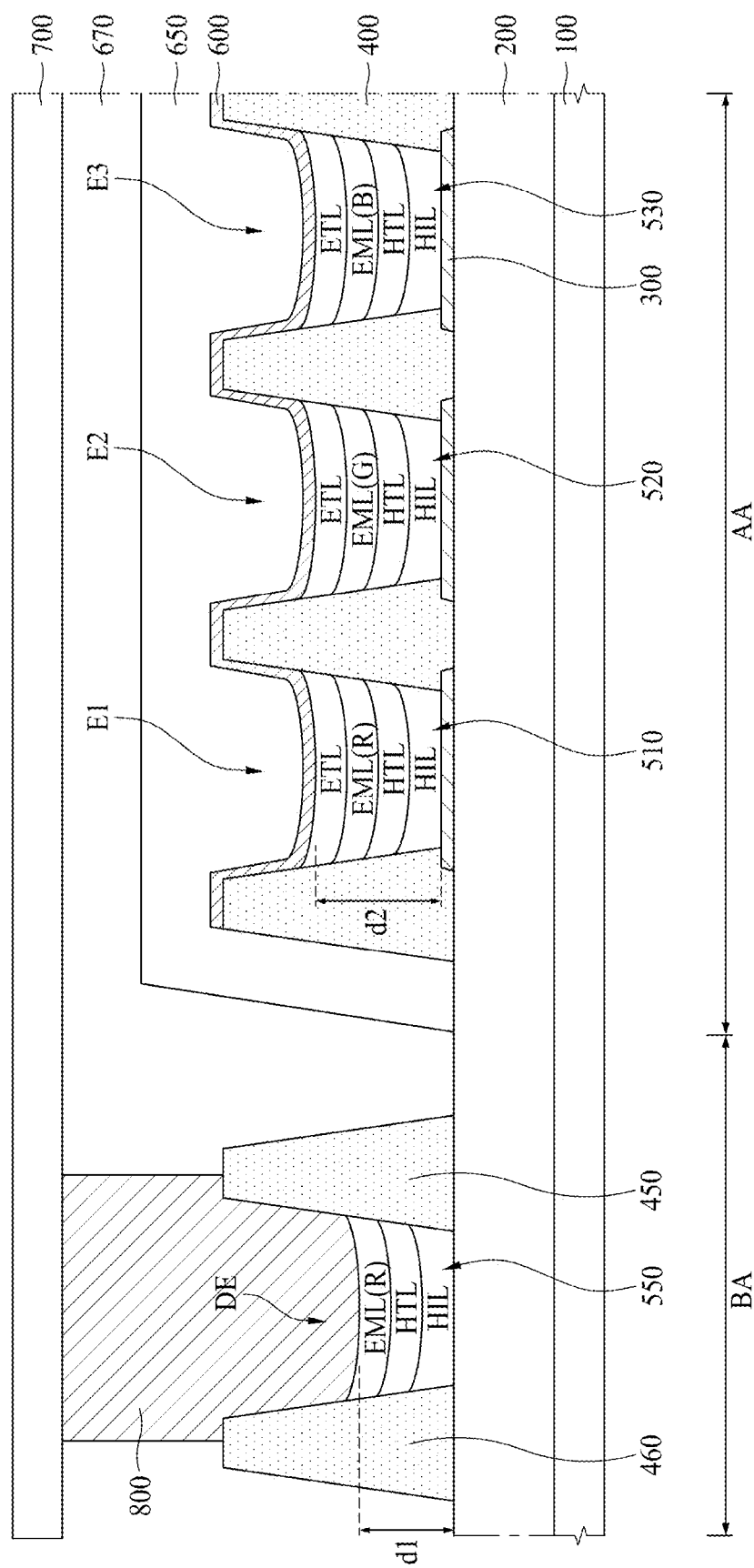

With reference to FIG. 7, the dummy light-emitting layer 550 may include the hole injecting layer HIL, the hole transporting layer HTL, and the red light-emitting material layer EML(R). That is, unlike the case of FIG. 5 described above, in FIG. 7, the dummy light-emitting layer 550 may not include the electron transporting layer ETL, the green light-emitting material layer EML(G), and the blue light-emitting material layer EML(B). Therefore, the first height d1 of the dummy light-emitting layer 550 may be lower than the second height d2 of the light-emitting layers 510, 520, and 530.

In FIG. 7, the reason why the dummy light-emitting layer 550 does not include the electron transporting layer ETL may be the same as that of FIG. 6 described above. Thus, a redundant description thereof will be omitted. In FIG. 7, the reason why the dummy light-emitting layer 550 does not include the green light-emitting material layer EML(G) and the blue light-emitting material layer EML(B) will be described.

In the case of FIG. 7, the red light-emitting material layer EML(R) may be applied to the first emission area E1, and the red light-emitting material layer EML(R) may be applied to the dummy emission area DE using an inkjet process. After that, the green light-emitting material layer EML(G) and the blue light-emitting material layer EML(B) may be applied to the second emission area E2 and the third emission area E3, respectively, and may subsequently be dried. That is, in the case of FIG. 7, the drying process may be simultaneously performed on the red light-emitting material layer EML(R), the green light-emitting material layer EML (G), and the blue light-emitting material layer EML(B). Thus, although the dummy light-emitting layer 550 may not include the green light-emitting material layer EML(G) and the blue light-emitting material layer EML(B), a profile of the green light-emitting material layer EML(G) and the blue light-emitting material layer EML(B) may be uniform in the entire active area AA. In FIG. 7, when an electrode for light emission and a circuit element are connected to the dummy light-emitting layer 550, a peak wavelength of PL of the dummy light-emitting layer 550 may be within a range of about 600 nm to 650 nm, like the range of the peak wavelength of PL of the first light-emitting layer 510.

Figure 8:
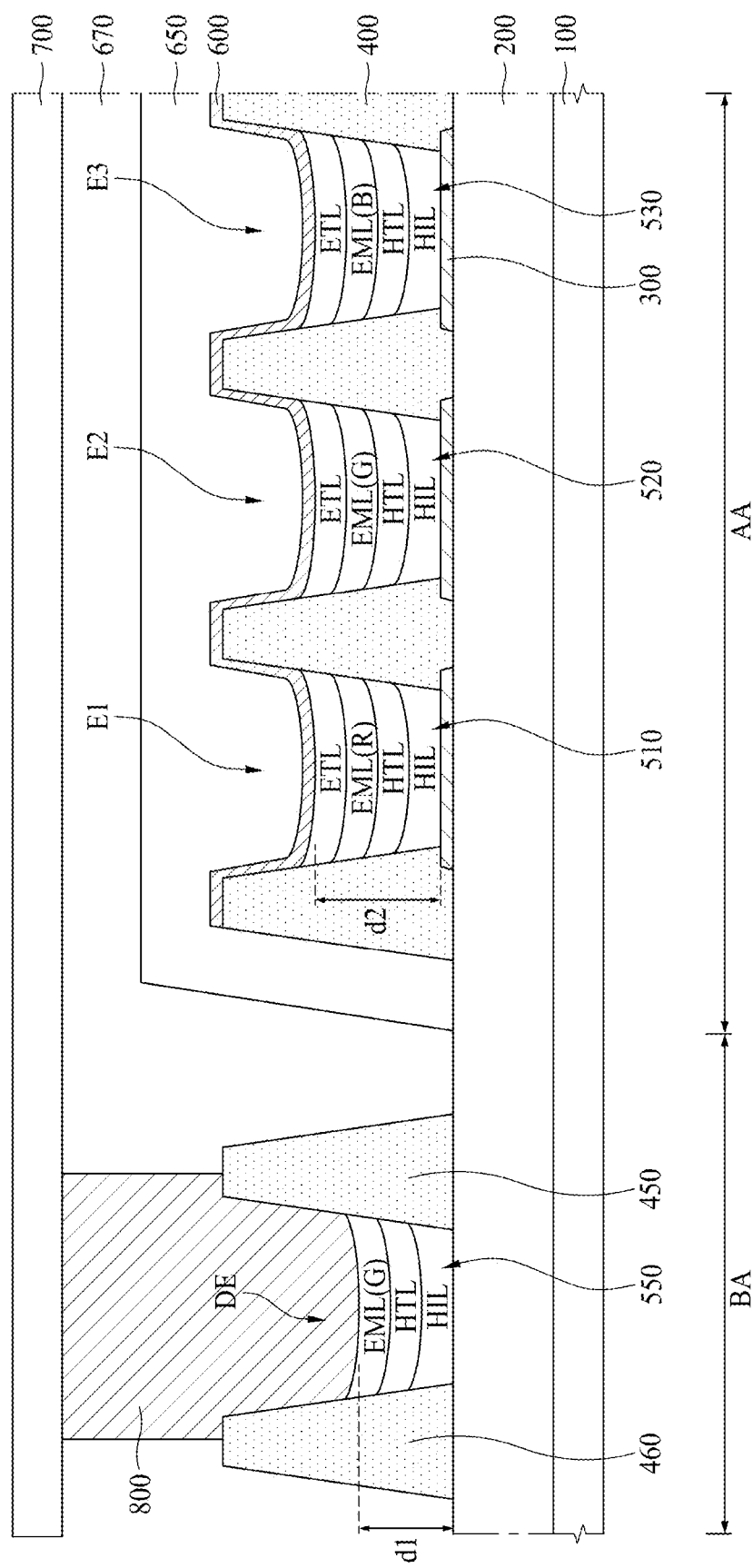

With reference to FIG. 8, the dummy light-emitting layer 550 may include the hole injecting layer HIL, the hole transporting layer HTL, and the green light-emitting material layer EML(G). That is, unlike the case of FIG. 5 described above, in FIG. 8, the dummy light-emitting layer 550 may not include the electron transporting layer ETL, the red light-emitting material layer EML(R), and the blue light-emitting material layer EML(B).

Figure 9:
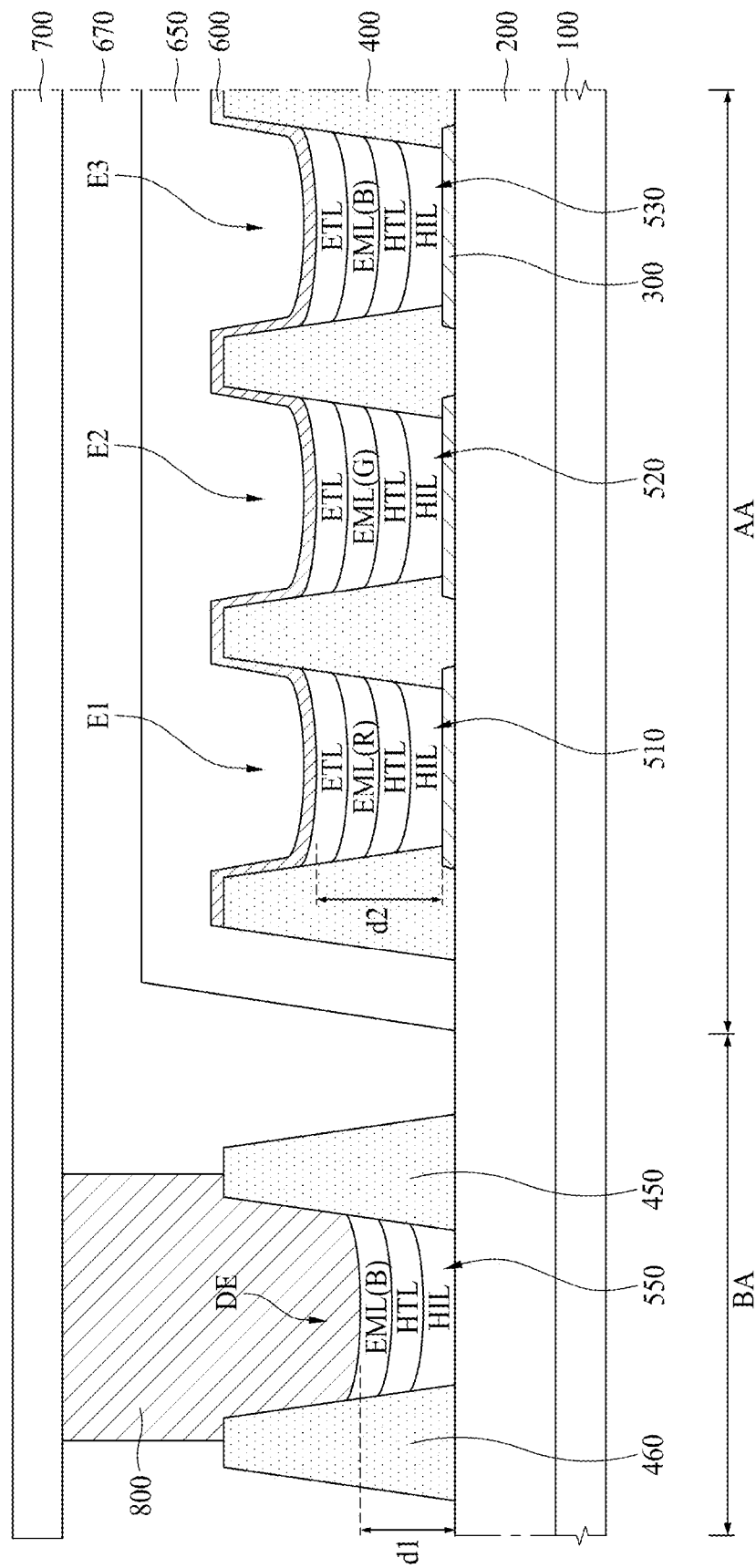

With reference to FIG. 9, the dummy light-emitting layer 550 may include the hole injecting layer HIL, the hole transporting layer HTL, and the blue light-emitting material layer EML(B). That is, unlike the case of FIG. 5 described above, in FIG. 9, the dummy light-emitting layer 550 may not include the electron transporting layer ETL, the red light-emitting material layer EML(R), and the green light-emitting material layer EML(G).

Thus, in the case of FIGS. 8 and 9, the first height d1 of the dummy light-emitting layer 550 may be lower than the second height d2 of the light-emitting layers 510, 520, and 530. The reason why the dummy light-emitting layer 550 does not include the electron transporting layer ETL in FIGS. 8 and 9 may be the same as that of FIG. 6 described above. Also, the reason why the dummy light-emitting layer 550 may not include the red light-emitting material layer EML(R) and the blue light-emitting material layer EML(B) in FIG. 8 and the reason why the dummy light-emitting layer 550 may not include the red light-emitting material layer EML(R) and the green light-emitting material layer EML(G) may be because that a drying process may be simultaneously performed on the red light-emitting material layer EML(R), the green light-emitting material layer EML(G), and the blue light-emitting material layer EML(B) as in FIG. 7 described above.

In FIG. 8, when an electrode for light emission and a circuit element are connected to the dummy light-emitting layer 550, a peak wavelength of PL of the dummy light-emitting layer 550 may be within a range of about 500 nm to 550 nm, like the range of the peak wavelength of PL of the second light-emitting layer 520. Also, in FIG. 9, when an electrode for light emission and a circuit element are connected to the dummy light-emitting layer 550, a peak wavelength of PL of the dummy light-emitting layer 550 may be within a range of about 430 nm to 480 nm, like the range of the peak wavelength of PL of the third light-emitting layer 530.

Meanwhile, although not shown, the dummy light-emitting layer 550 may have a structure in which two of the red light-emitting material layer EML(R), the green light-emitting material layer EML(G), and the blue light-emitting material layer EML(B) are stacked. Although not shown, the bank 400 illustrated in FIGS. 5 to 9 may include the first bank 410 and the second bank 420 as illustrated in FIG. 4 described above.

Figure 10:
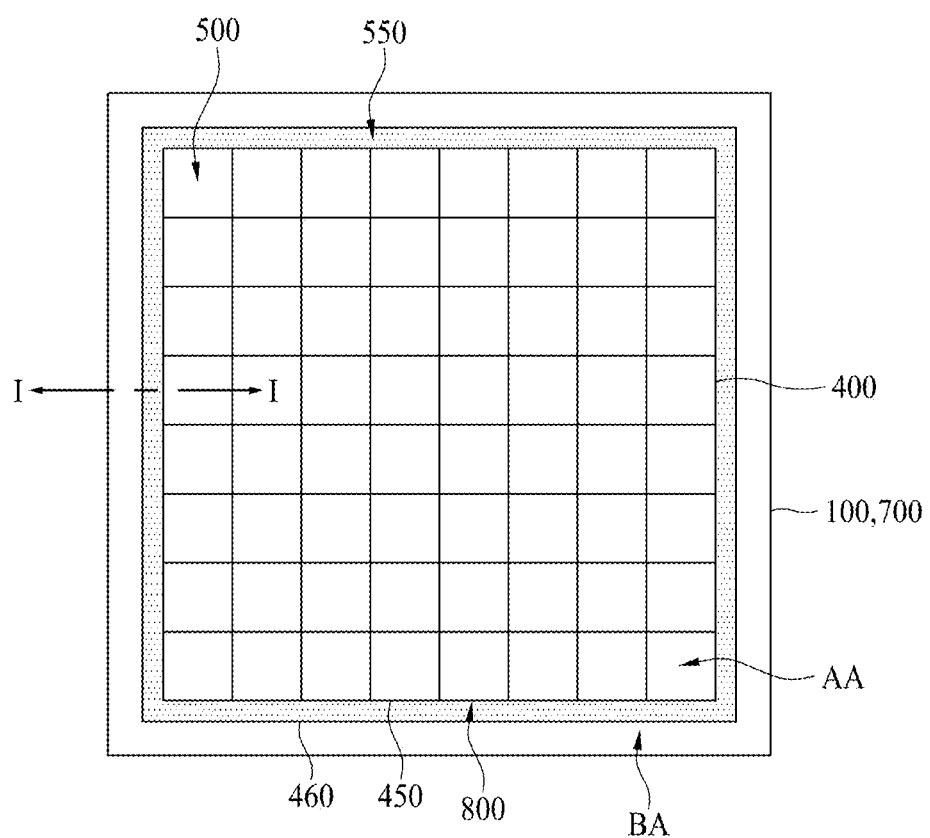
FIG. 10 is a plan view illustrating an electroluminescence display device according to another embodiment of the present disclosure.
Figure 11:
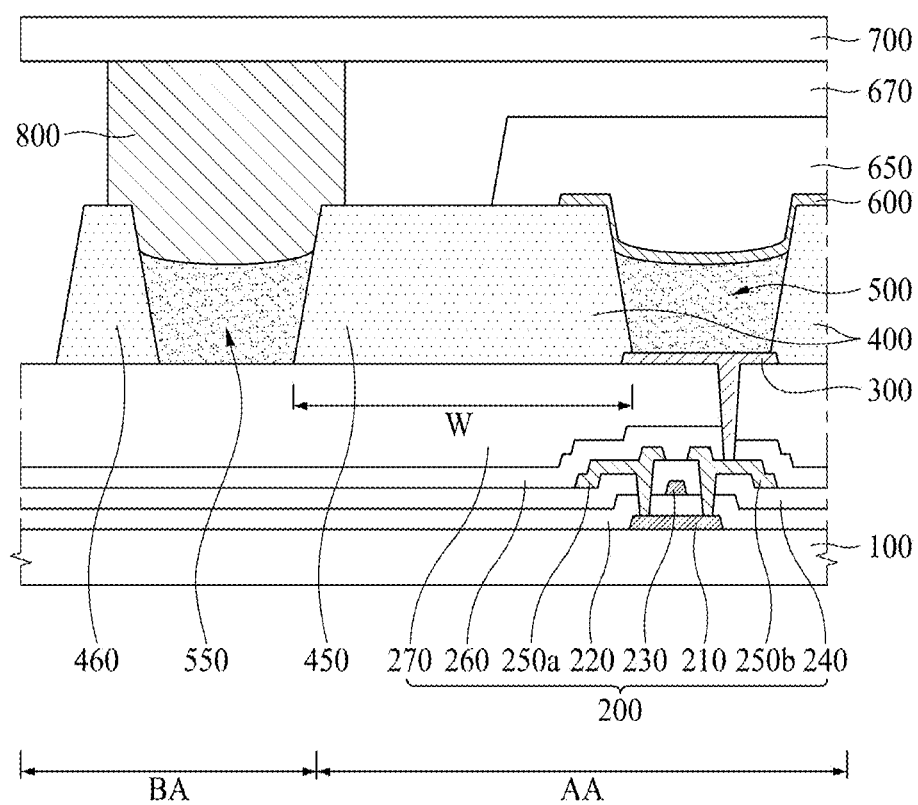
FIG. 11 is a cross-sectional view taken along line I-I of FIG. 10.

FIG. 10 is a plan view illustrating an electroluminescence display device according to another embodiment of the present disclosure. FIG. 11 is a cross-sectional view, taken along line I-I of FIG. 10.

The electroluminescence display device of FIGS. 10 and 11 is substantially similar to the electroluminescence display device described above with reference to FIG. 2 in that the first dam 450 provided in the bonding area BA may be connected to the outermost bank 400 provided in the active area AA. Thus, only a different configuration will be described in detail below.

In FIG. 2 described above, the first dam 450 provided in the bonding area BA may be adjacent to the outermost bank 400 in the active area AA, but is not in contact with the outermost bank 400. In contrast, in FIGS. 10 and 11, the first dam 450 may be in contact (e.g., in direct contact) with or formed as one body with the outermost bank 400. That is, in FIGS. 10 and 11, a width W of the outermost bank 400 may be increased to be greater than a width of the other banks 40, and an inner portion thereof may be used as the bank 400 of the active area AA to define an emission area in the active area AA, while an outer portion thereof may be used as the first dam 450 of the bonding area BA to define a dummy emission area in the bonding area BA.

In the case of FIGS. 10 and 11, when the bonding area BA and the active area AA are in contact with each other, a bezel width of the electroluminescence display device may be further reduced. Although not shown, in the structure of FIGS. 10 and 11, the dummy light-emitting layer 550 may be variously modified as in FIGS. 5 to 9, and the bank 400 may include the first bank 410 and the second bank 420 as in FIG. 4 described above.

According to an embodiment of the present disclosure, when the dummy light-emitting layer is provided in the bonding area bonding the first substrate and the second substrate, a profile of the light-emitting layer at the central region of the active area and a profile of the light-emitting layer at the edge region of the active area may be uniform. Thus, light emission may be uniformly made at the central region and the edge region of the active area. Further, according to an embodiment of the present disclosure, because there is no need to form a dummy region between the active area and the bonding area to make uniform light emission in the entire active area, a bezel width of the electroluminescence display device may be reduced.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An electroluminescence display device, comprising:
   a first substrate and a second substrate facing each other;
   a bank configured to define a plurality of emission areas on the first substrate;
   a light-emitting layer comprising:
   a first light-emitting layer including a first light-emitting material layer in a first emission area among the plurality of emission areas;
   a second light-emitting layer including a second light-emitting material layer in a second emission area among the plurality of emission areas; and
   a third light-emitting layer including a third light-emitting material layer in a third emission area among the plurality of emission areas;
   a first dam at an outer portion of the bank;
   a second dam at an outer portion of the first dam;
   a dummy light-emitting layer between the first dam and the second dam, the dummy light-emitting layer including the first light-emitting material layer, the second light-emitting material layer, and the third light-emitting material layer; and
   a sealant overlapping the dummy light-emitting layer, the sealant being between the first dam and the second dam,
   wherein the first light-emitting material layer, the second light-emitting material layer, and the third light-emitting material layer are disposed between the first dam and the second dam.

2. The electroluminescence display device of claim 1, wherein:
   the first light-emitting layer comprises a red light-emitting material layer;
   the second light-emitting layer comprises a green light-emitting material layer;
   the third light-emitting layer comprises a blue light-emitting material layer; and
   the dummy light-emitting layer comprises at least two of: the red light-emitting material layer, the green light-emitting material layer, and the blue light-emitting material layer.

3. The electroluminescence display device of claim 1, wherein:
   the first light-emitting layer comprises a red light-emitting material layer;
   the second light-emitting layer comprises a green light-emitting material layer;
   the third light-emitting layer comprises a blue light-emitting material layer; and
   the dummy light-emitting layer comprises one of: the red light-emitting material layer, the green light-emitting material layer, and the blue light-emitting material layer.

4. The electroluminescence display device of claim 1, wherein:
   the first light-emitting layer, the second light-emitting layer, and the third light-emitting layer comprise an electron transporting layer; and
   the electron transporting layer is not in the dummy light-emitting layer.

5. The electroluminescence display device of claim 1, wherein a height of the dummy light-emitting layer is different from a height of the first light-emitting layer.

6. The electroluminescence display device of claim 1, wherein the first dam is in contact with an outermost portion of the bank.

7. The electroluminescence display device of claim 1, wherein:
- a height of an upper end of the first light-emitting layer at a central portion of the emission area is lower than a height of an upper end of the first light-emitting layer at an end of the emission area;
- the bank comprises a first bank and a second bank on the first bank; and
- the second bank has a width narrower than a width of the first bank and has a thickness greater than a thickness of the first bank.

8. An electroluminescence display device, comprising:
- a first substrate comprising:
- an active area configured to display an image; and
- a second substrate facing the first substrate;
- a bank configured to define an emission area in the active area;
- a plurality of light-emitting layers in the emission area;
- a first dam and a second dam configured to define a dummy emission area, and surrounding the active area;
- a dummy light-emitting layer including a plurality of light-emitting material layers in the dummy emission area; and
- a sealant overlapping the dummy light-emitting layer, the sealant being between the first substrate and the second substrate,
- wherein the plurality of the light-emitting material layers are disposed between the first dam and the second dam.

9. The electroluminescence display device of claim 8, wherein the dummy light-emitting layer surrounds the active area.

10. The electroluminescence display device of claim 8, wherein the dummy light-emitting layer and the sealant are between the first dam and the second dam.

11. The electroluminescence display device of claim 8, wherein:
- the first dam contacts an outermost portion of the bank; and
- the second dam is at an outer portion of the first dam.

12. The electroluminescence display device of claim 8, wherein:
- the plurality of the light-emitting layers comprises any one of: a red light-emitting material layer, a green light-emitting material layer, and a blue light-emitting material layer; and
- the dummy light-emitting layer comprises one or more material layers among: the red light-emitting material layer, the green light-emitting material layer, and the blue light-emitting material layer.

13. The electroluminescence display device of claim 8, wherein a height of the dummy light-emitting layer is different from a height of each of the plurality of the light-emitting layers.

14. An electroluminescence display device, comprising:
- a first substrate and a second substrate comprising an active area displaying an image and a bonding area provided at an outer portion of the active area;
- a light-emitting layer including any one of a first light-emitting material layer, a second light-emitting material layer, and a third light-emitting material layer in the active area;
- a dummy light-emitting layer provided in the bonding area, the dummy light-emitting layer including the first light-emitting material layer, the second light-emitting material layer, and the third light-emitting material layer; and
- a sealant overlapping the dummy light-emitting layer, the sealant being configured to bond the first substrate and the second substrate; and
- a light-emitting layer in the active area,
- wherein the first light-emitting material layer, the second light-emitting material layer, and the third light-emitting material layer are overlapping in the bonding area.

15. The electroluminescence display device of claim 14, wherein the dummy light-emitting layer surrounds the active area.

16. The electroluminescence display device of claim 14, wherein the bonding area contacts the active area.

17. The electroluminescence display device of claim 14, wherein:
- the first light-emitting material layer comprises a red light-emitting material layer;
- the second light-emitting material layer comprises a green light-emitting material layer; and
- the third light-emitting material layer comprises a blue light-emitting material layer.

18. The electroluminescence display device of claim 14, wherein a height of the dummy light-emitting layer is different from a height of the light-emitting layer.

* * * * *